United States Patent
Hong

(10) Patent No.: US 6,642,596 B2
(45) Date of Patent: Nov. 4, 2003

(54) SEMICONDUCTOR DEVICE HAVING TRENCH ISOLATION STRUCTURE AND METHOD OF FORMING SAME

(75) Inventor: Sug-hun Hong, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/290,235

(22) Filed: Nov. 8, 2002

(65) Prior Publication Data

US 2003/0071321 A1 Apr. 17, 2003

Related U.S. Application Data

(62) Division of application No. 10/043,330, filed on Jan. 14, 2002, now Pat. No. 6,501,149.

(51) Int. Cl.[7] .............................................. H01L 31/115
(52) U.S. Cl. ...................................................... 257/429
(58) Field of Search ................................ 438/424, 429, 438/430, 269, 435; 257/510, 513

(56) References Cited

U.S. PATENT DOCUMENTS

| 4,924,284 | A | 5/1990 | Beyer et al. |
|---|---|---|---|
| 4,945,069 | A | 7/1990 | Carter |
| 5,236,863 | A | 8/1993 | Iranmanesh |
| 5,250,461 | A | 10/1993 | Sparks |
| 5,384,280 | A | 1/1995 | Aoki et al. |
| 5,923,073 | A | 7/1999 | Aoki et al. |

*Primary Examiner*—Carl Whitehead, Jr.
*Assistant Examiner*—David S. Blum
(74) *Attorney, Agent, or Firm*—Volentine Francos, PLLC

(57) ABSTRACT

A semiconductor device having a trench isolation region including an anti-oxidative liner formed to be thin enough to minimize etch wastage caused by a wet etching solution according to a wet loading effect, and a trench isolation method of forming the same. The semiconductor device includes a silicon substrate and a trench isolation region formed in the silicon substrate. A silicon epitaxial growth layer contacts the silicon substrate at a bottom surface of the trench isolation region and fills the lower half of the trench isolation region. A first oxide layer has an L-shaped cross-section and extends from a sidewall of the trench isolation region to a portion of the bottom surface of the trench isolation region. An anti-oxidative liner has an L-shaped cross-section, and extends between the first oxide layer and the silicon epitaxial growth layer, with its inner surface contacting the silicon epitaxial growth layer. A second oxide layer fills the upper half of the trench isolation region on the silicon epitaxial growth layer.

21 Claims, 9 Drawing Sheets

SEMICONDUCTOR DEVICE HAVING TRENCH ISOLATION STRUCTURE AND METHOD OF FORMING SAME

CROSS-REFERENCE TO RELATED APPLICATIONS

This is a divisional of application Ser. No. 10/043,330, filed Jan. 14, 2002, U.S. Pat. No. 6,501,149 which is incorporated herein by reference in its entirety.

BACKGROUND OF THE INVENTION

1. Field of the Invention

The present invention relates to a semiconductor device and a manufacturing method thereof, and more particularly, to a semiconductor device having a trench isolation structure and a method of forming the trench isolation structure.

2. Description of the Related Art

As the integration of semiconductor devices has increased and feature size has decreased, trench isolation regions have been reduced accordingly. Also, the portable devices that are in widespread use today generally require a low voltage power supply for operation. Therefore, this trend toward high density and low consumptive power characteristics requires continued improvement in semiconductor device fabrication methods.

Trench isolation, which is one of the initial steps in a semiconductor device manufacturing process, affects the size of active areas and process margins in subsequent processes. Trench isolation methods are the most common isolation method for highly integrated semiconductor devices.

In one conventional trench isolation method, a trench is formed by etching a silicon substrate and then filling it with a dielectric material using a chemical vapor deposition (CVD) method. Next, an isolating layer is formed in the trench by planarizing the filled structure using a chemical mechanical polishing (CMP) method.

However, when the density of an isolation area increases, the aspect ratio of the trench increases and it becomes more difficult to fill the trench with the dielectric material using the CVD method without the occurrence of voids.

Moreover, in this conventional method, after the isolation area is formed, the silicon substrate is excessively stressed by subsequent high temperature thermal treatment and oxidation processes. As a result, silicon lattice defects such as dislocation occur, and an active area near the corner of the trench which defines the isolation area is oxidized.

Accordingly, to prevent the above problems, another technique has been utilized. According to this technique, before a dielectric material is filled in a trench, a thin oxide layer is formed on the inner wall of the trench. Next, a silicon nitride liner is formed on the oxide layer to a thickness of about 100~700 Å (angstroms). This prevents the silicon substrate from being excessively stressed by subsequent high thermal treatment and oxidation processes. In this case, the stress to a silicon substrate is relieved by forming a silicon nitride liner in a trench, and an active area in the silicon substrate is prevented from being oxidized near the corner of the trench.

The remaining space in the trench, which is lined with the silicon nitride liner, is fully filled with a dielectric material. Then a general wet etching process is performed using phosphoric acid to remove a silicon nitride layer which was used as an etching mask when the trench was formed. However, if the silicon nitride liner has a thickness of 100 Å, it is etched along with the silicon nitride layer during the wet etching process. As a result, dents form between the isolation area and the active area. The dents in the substrate can cause certain problems, such as a double turn-on phenomenon in a transistor, i.e., a hump phenomenon. In addition, there may be a decrease in the threshold voltage in those semiconductor devices manufactured using a substrate having dents. Also, a polysilicon residue used as a gate electrode material may create a bridge between adjacent gate electrodes, thereby deteriorating the electrical properties of a semiconductor device.

SUMMARY OF THE INVENTION

To solve the above problems, it is an object of the present invention to provide a semiconductor device with a trench isolation region having a large aspect ratio without voids, and a substrate that is dent-free between an isolation area and an active area.

It is another object of the present invention to provide a trench isolation method capable of filling a trench having a large aspect ratio with a dielectric material, by which method voids are not formed inside a trench isolation region, dents are not formed between an isolation area and an active area, a silicon substrate is effectively prevented from being excessively stressed, and the active area is effectively prevented from being oxidized near the corner of the trench.

Accordingly, to achieve the above first object, there is provided a semiconductor device including a silicon substrate and a trench isolation region having a bottom surface and sidewalls, and being formed in the silicon substrate to isolate adjacent two active areas. A silicon epitaxial growth layer contacts the silicon substrate at the bottom surface of the trench isolation region and fills the lower half of the trench isolation region. A first oxide layer has an L-shaped cross-section and extends from the sidewall of the trench isolation region to a portion of the bottom surface of the trench isolation region. An anti-oxidative liner has an L-shaped cross-section and extends between the first oxide layer and the silicon epitaxial growth layer. The surface of the anti-oxidative line contacts the silicon epitaxial growth layer. A second oxide layer fills the upper half of the trench isolation region on the silicon epitaxial growth layer. The silicon substrate has a crystal orientation of [100]. The first oxide layer is formed of thermal oxide and the anti-oxidative liner has a thickness of 50~70 Å. The anti-oxidative liner is formed of silicon nitride ($Si_3N_4$), boron nitride (BN), or alumina ($Al_2O_3$). The semiconductor device may further include an oxide liner interposed between the anti-oxidative liner and the second oxide layer.

To achieve the second object, there is provided a trench isolation method. In the trench isolation method, a trench is formed to a predetermined depth in a silicon substrate. A first oxide layer is formed on a bottom surface and sidewalls of the trench. An anti-oxidative liner is formed on the first oxide layer. The semiconductor substrate is exposed at the bottom surface of the trench by partially removing the anti-oxidative liner and the first oxide layer. A silicon epitaxial growth layer, partially filling the inside of the trench defined by the anti-oxidative liner, is formed by selectively epitaxially growing silicon from the exposed silicon substrate. A second oxide layer is formed on the silicon epitaxial growth layer to fully fill the trench.

Exposing the semiconductor substrate at the bottom surface of the trench includes: forming a protective oxide layer on the entire surface of the resultant structure having the anti-oxidative liner; etching back the protective oxide layer to form a protective spacer covering the anti-oxidative liner extended along the sidewalls of the trench and to expose the silicon substrate at the bottom surface of the trench; and removing the protective spacer. The protective spacer is removed by a wet etching method or a dry etching method. After exposing the semiconductor substrate at the bottom surface of the trench, a sacrificial oxide layer is formed on the exposed silicon substrate and the sacrificial oxide layer is removed. The silicon epitaxial growth layer is formed on the silicon substrate from which the sacrificial oxide layer is removed. After forming the silicon epitaxial growth layer, an oxide liner is formed on the exposed surface of the anti-oxidative liner, and the second oxide layer is formed on the oxide liner.

According to the present invention, the aspect ratio of the inside of the trench to be filled decreases in a deposition process for filling the trench and thus voids are not formed inside the trench. Also, an anti-oxidative liner is formed in the trench isolation region of the semiconductor device. The anti-oxidative liner is thin enough to minimize etch wastage caused by a subsequent wet etching solution, and thus it can efficiently prevent a silicon substrate from being excessively stressed and an active area from being oxidized near the corner of the trench. Further, no dents are formed between the isolation area and the active area, thereby improving the electrical properties of the semiconductor devices.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
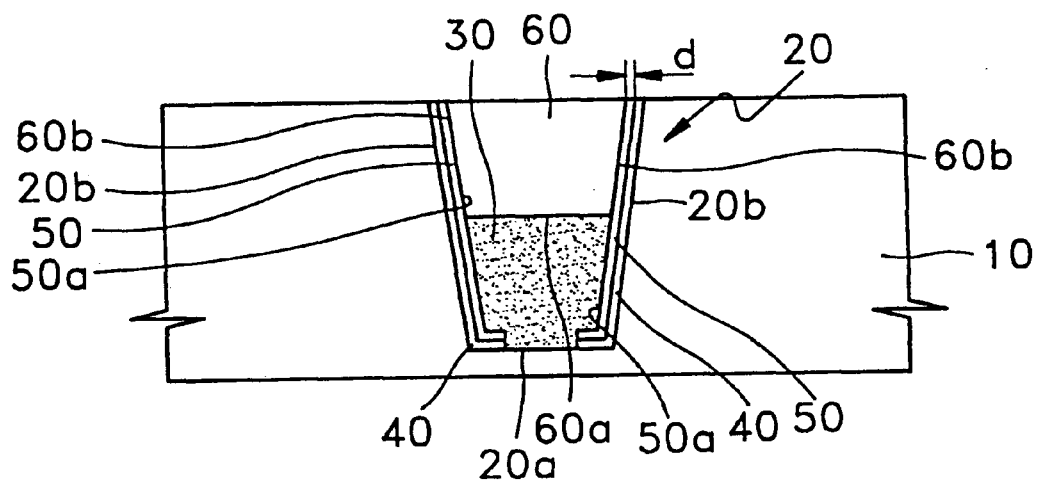
FIG. 1 is a cross-sectional view illustrating the structure of a semiconductor device according to an embodiment of the present invention.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Also, when it is described that a layer is formed "on" another layer or a substrate, the layer can be formed directly on the other layer or the substrate, or other layers can intervene therebetween.

FIG. 1 shows a cross-sectional view of the structure of a semiconductor device according to an embodiment of the present invention. Referring to FIG. 1, a semiconductor device includes a trench isolation region 20 for isolating two adjacent active areas in a silicon substrate 10. A silicon epitaxial growth layer 30 is exposed on a bottom surface 20a of the trench isolation region 20. In other words, the silicon epitaxial growth layer 30 contacts the silicon substrate 10 at the interface along the bottom surface 20a of the trench isolation region 20. Also, the silicon epitaxial growth layer 30 partially fills a lower portion, preferably the lower half, of the trench isolation region 20. The silicon substrate 10 has a crystal orientation of [100], which is appropriate for forming the silicon epitaxial growth layer 30.

A first oxide layer 40, having a substantially "L"-shaped cross-section, extends along a sidewall 20b to a portion of the bottom surface 20a of the trench isolation region 20. The first oxide layer 40 may be formed of thermal oxide and has a thickness of 30~110 Å.

An anti-oxidative liner 50, having a substantially "L"-shaped cross-section, is formed between the first oxide layer 40 and the silicon epitaxial growth layer 30. The anti-oxidative liner 50 may be made of silicon nitride ($Si_3N_4$), boron nitride (BN) or alumina ($Al_2O_3$), for example. The anti-oxidative liner 50 has an inner surface 50a in contact with the silicon epitaxial growth layer 30.

Also, the anti-oxidative liner 50 has a thickness (d) of about 50~70 Å, preferably, a thickness of about 55~65 Å. Test results of wet loading effects of anti-oxidative liners having various thicknesses show that the anti-oxidative liner 50 is thin enough to minimize etch wastage caused by an etching solution, even if its upper surface is exposed during a wet etching process used for removing unnecessary layers. Consequently, a portion of the anti-oxidative liner 50 between the trench isolation region 20 and an active area of the silicon substrate 10 is prevented from being removed by a wet etching process and thus dents can be prevented from forming.

A second oxide layer 60, which is filled in the remaining portion, preferably the upper half, of the trench isolation region 20, is formed on the silicon epitaxial growth layer 30. The second oxide layer 60 may be formed by plasma enhanced chemical vapor deposition (PECVD), low pressure CVD (LPCVD), atmospheric pressure CVD (APCVD) or high density plasma CVD (HDPCVD). Also, the second oxide layer 60 may be formed of spin on glass (SOG). The second oxide layer 60 may either be a monolayer or multilayer.

In the trench isolation region 20, a bottom surface 60a of the second oxide layer 60 is in contact with the epitaxial growth layer 30, and the sidewalls 60b of the second oxide layer 60 are in contact with the anti-oxidative liner 50.

Figure 2:
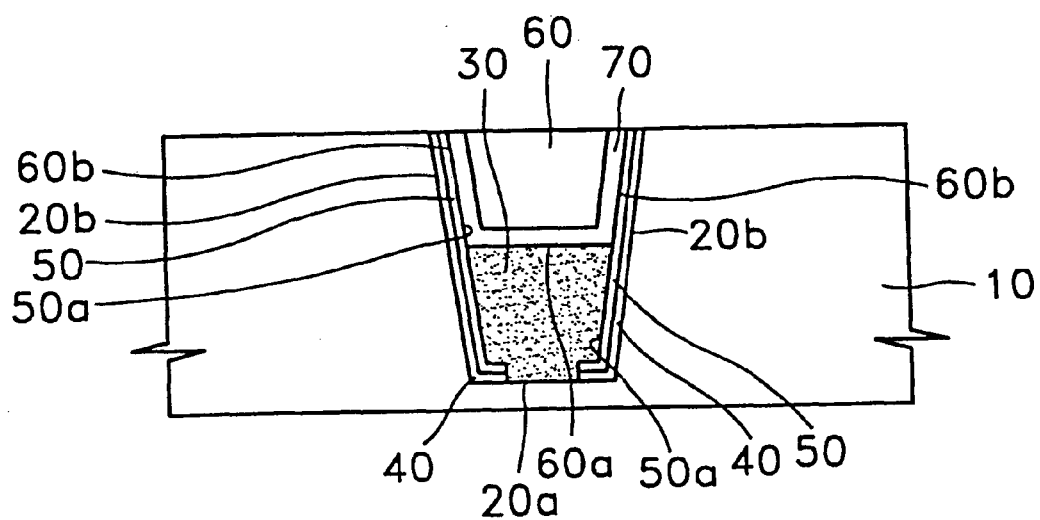
FIG. 2 is a cross-sectional view illustrating the structure of a semiconductor device according to another embodiment of the present invention.

A cross-sectional view of the structure of a semiconductor device according to another embodiment of the present invention is shown in FIG. 2. Like reference numerals in FIG. 2 denote the same elements in FIG. 1 and thus detailed descriptions thereof will be omitted.

The semiconductor device illustrated in FIG. 2 is different from that illustrated in FIG. 1 in that an oxide liner 70 is interposed between an anti-oxidative liner 50 and the second oxide layer 60. The oxide liner 70 may be made of a high temperature oxide (HTO) and has a thickness of about 100~500 Å. The oxide liner 70 protects the anti-oxidative liner 50 from being damaged by a plasma atmosphere when the second oxide layer 60 is formed. Thus, the oxide liner 70 is more effective when the second oxide layer 60 is formed by a deposition method using plasma, for example, HDPCVD.

Figure 3A:
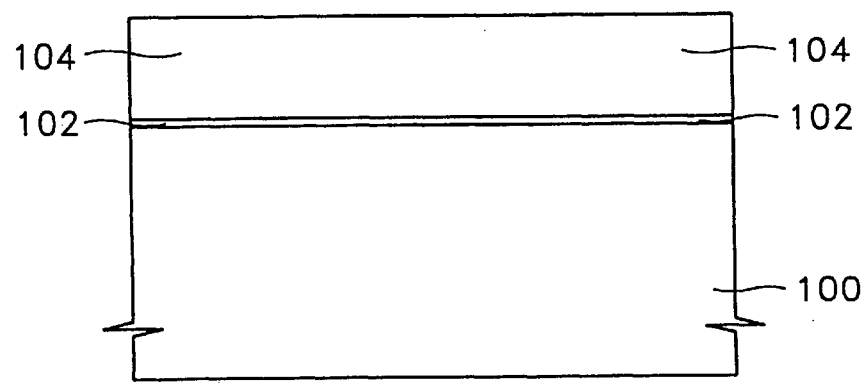
FIGS. 3A through 3M are cross-sectional views for describing the steps of a trench isolation method according to an embodiment of the present invention.

FIGS. 3A through 3M illustrate cross-sectional views for describing the steps of a trench isolation method according to an embodiment of the present invention. With reference to FIG. 3A, a pad oxide layer 102 made of thermal oxide is formed to a thickness of about 100~300 Å on a silicon substrate 100 with a crystal orientation of [100]. A silicon nitride layer 104 is formed to a thickness of about 1000~3000 Å on the pad oxide layer 102 by a LPCVD or PECVD method.

Figure 3B:
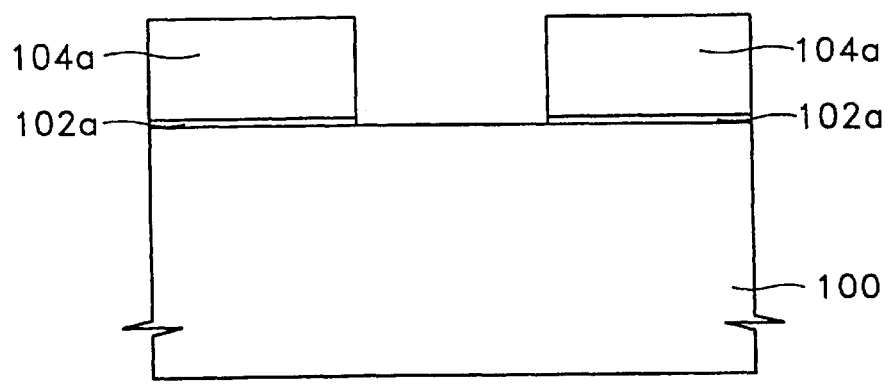

Referring to FIG. 3B, a pad oxide layer pattern 102a and a silicon nitride layer pattern 104a, defining an active area of the silicon substrate 100, are formed by patterning the pad oxide layer 102 and the silicon nitride layer 104 using a conventional photolithographic process. A portion of the silicon substrate 100 is exposed through the pad oxide layer pattern 102a and the silicon nitride layer pattern 104a.

Figure 3C:
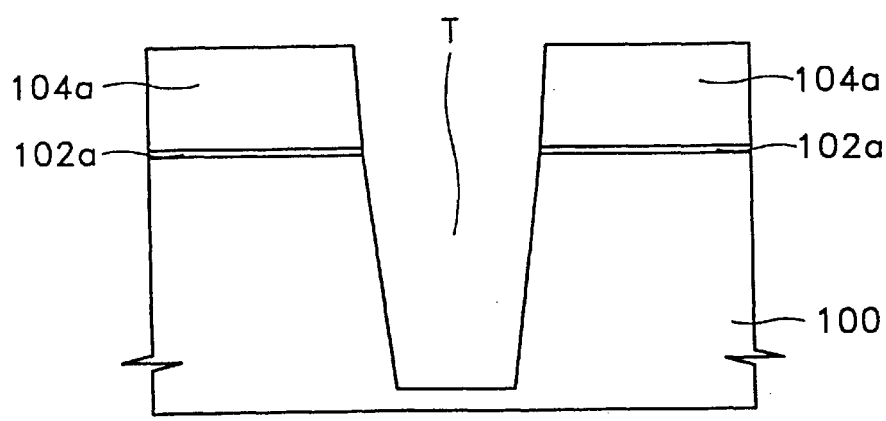

With reference to FIG. 3C, a trench T is formed to a predetermined depth by etching the exposed silicon substrate 100 using the pad oxide layer pattern 102a and the silicon nitride layer pattern 104a as an etching mask.

Figure 3D:
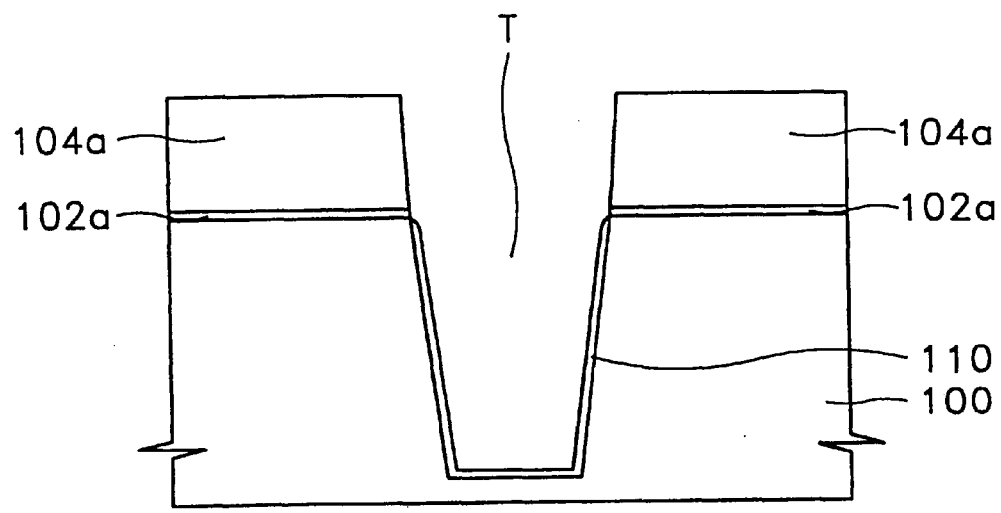

Referring to FIG. 3D, a first oxide layer 110 made of thermal oxide is formed to a thickness of about 100~300 Å on the sidewalls and bottom surface of the trench T by oxidizing the silicon exposed by the trench T.

Figure 3E:
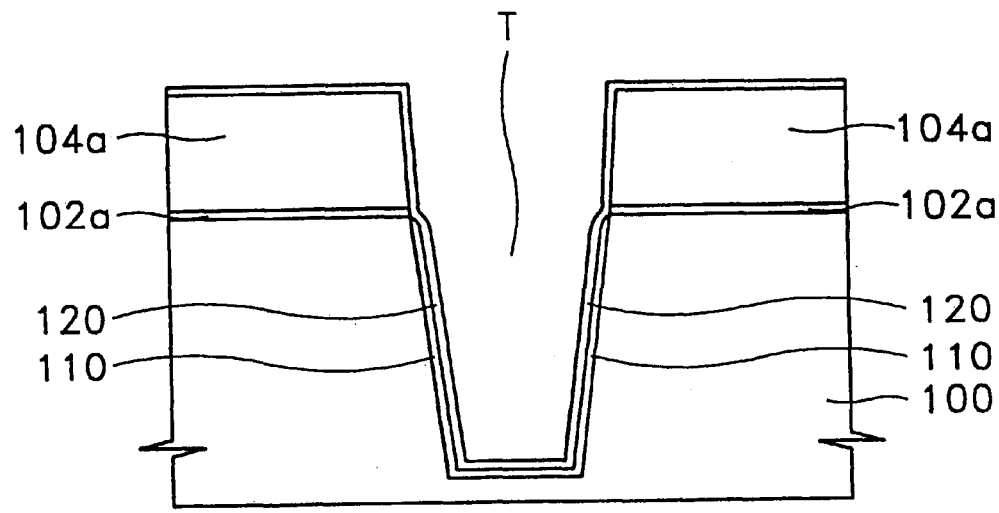

With reference to FIG. 3E, an anti-oxidative liner 120 is formed over the entire surface of the resultant structure having the first oxide layer 110 so as to cover the first oxide layer 110. The anti-oxidative liner 120 is formed to a thickness of about 50~70 Å, preferably, to a thickness of about 55~65 Å. The anti-oxidative liner 120 may be formed of silicon nitride ($Si_3N_4$), boron nitride (BN) or alumina ($Al_2O_3$), for example.

Figure 3F:
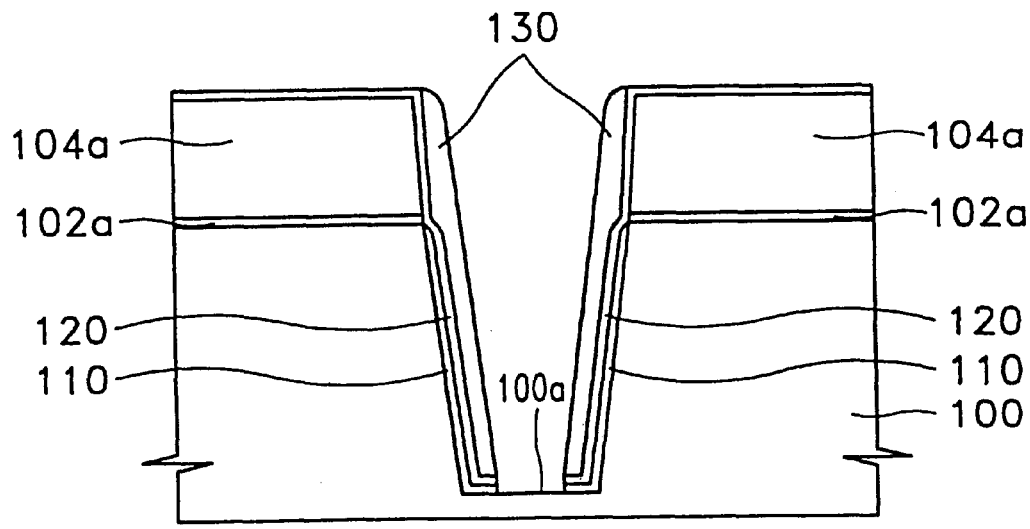
Figure 3G:
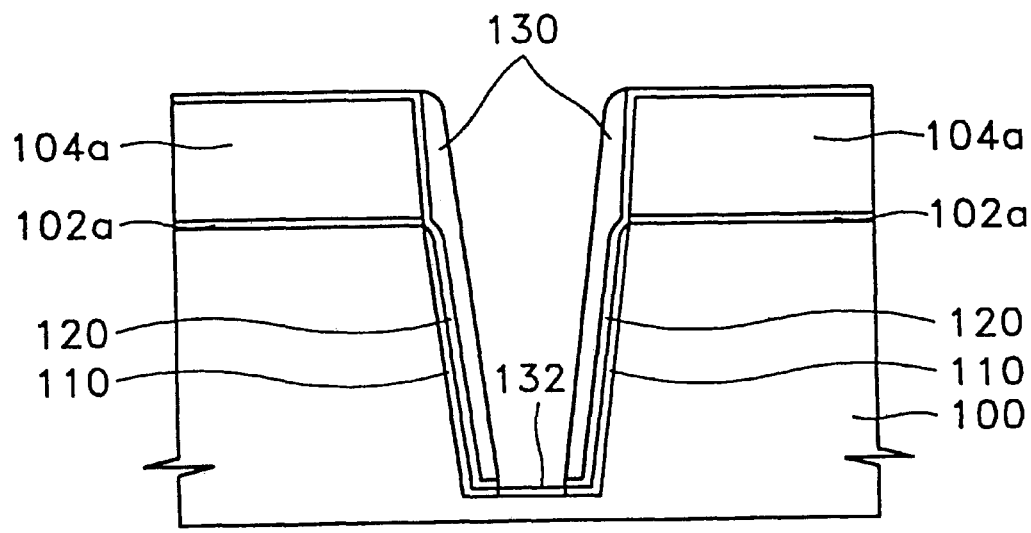
Figure 3H:
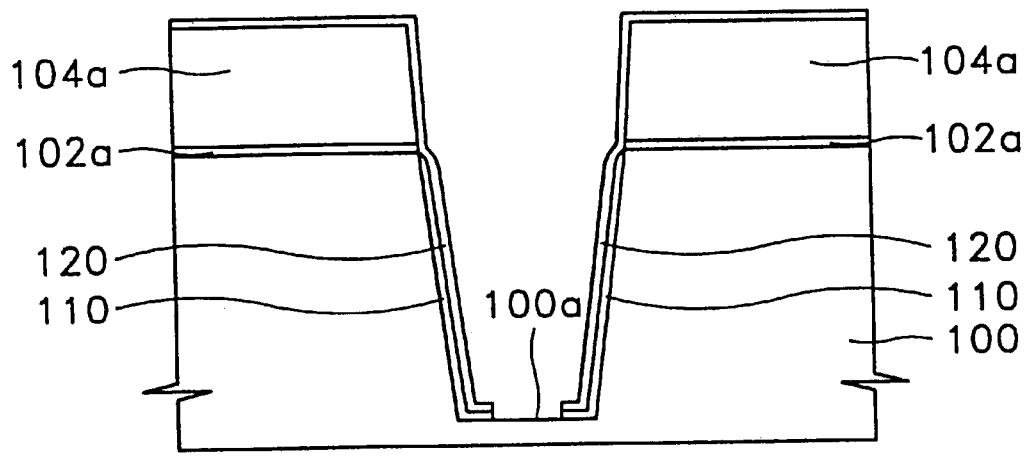

FIGS. 3F through 3H illustrate cross-sectional views for describing the steps of partially removing the anti-oxidative liner 120 and the first oxide layer 110 at the bottom surface of the trench T to expose the silicon substrate 100. In detail, a protective oxide layer is formed over the entire surface of the resultant structure having the anti-oxidative liner 120. A resulting protective spacer 130 is formed, which covers the anti-oxidative liner 120 extending along the sidewall of the trench T, by etching back the protective oxide layer. The protective spacer 130 is about 200~1000 Å wide. During the etching back process that forms the protective spacer 130, the anti-oxidative liner 120 and the first oxide layer 110 are also partially removed at the bottom surface of the trench T, thereby partially exposing a surface 100a of the silicon substrate 100 as shown in FIG. 3F.

Referring to FIG. 3G, the exposed surface 100a of the silicon substrate 100 may be damaged during the etching back process for forming the protective spacer 130. Therefore, to cure the surface 100a of the silicon substrate 100, a sacrificial oxide layer 132 is formed on the surface 100a. The sacrificial oxide layer 132 may be formed to a thickness of about 100~300 Å by thermally oxidizing the exposed surface 100a. The steps of forming the sacrificial oxide layer 132 may be omitted if necessary.

Figure 3I:
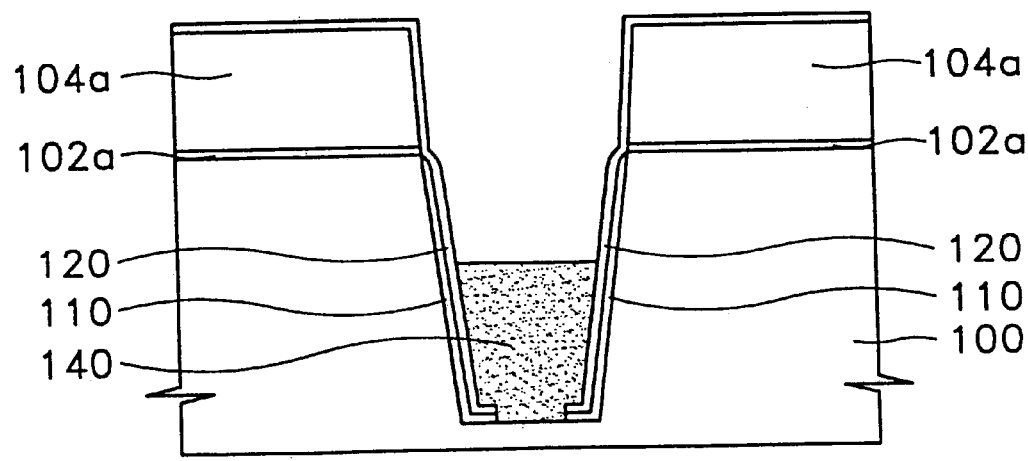

With reference to FIG. 3H, the protective spacer 130 and the sacrificial oxide layer 132 are removed using a dry or wet etching method. Referring to FIG. 3I, silicon is selectively epitaxially grown from the surface 100a of the silicon substrate 100 exposed at the bottom surface of the trench T due to the removal of the sacrificial oxide layer 132. As a result, a silicon epitaxial growth layer 140 is formed to fill a portion of the inside of the trench T which is delimited by the anti-oxidative liner 120. At this time, LPCVD or ultra high vacuum CVD (UHVCVD) may be used for the selective epitaxial growth of the silicon. Also, a thermal treatment may be performed at about 850° C. by supplying dichlorosilane (DCS: $SiH_2Cl_2$) or monosilane ($SiH_4$) as a silicon source gas in order to selectively epitaxially grow the silicon.

It is preferable that the silicon epitaxial growth layer 140 fills about half the depth of the trench T. Thus, the silicon epitaxial growth layer 140 is formed to a thickness of about 500~3000 Å at the lower portion of the trench T. By filling the lower portion of the trench T, the aspect ratio of the remaining space to be filled in the trench T essentially decreases so that voids are not formed in a subsequent filling process. Also, in a case where the anti-oxidative liner 120 is made of silicon nitride, the characteristics of the interface between the anti-oxidative liner 120 and the silicon epitaxial growth layer 140 are excellent. Consequently, leakage current in a semiconductor device to be manufactured decreases so that excellent electrical properties are obtained. A more detailed description of this will follow later with reference to FIG. 5.

Figure 3J:
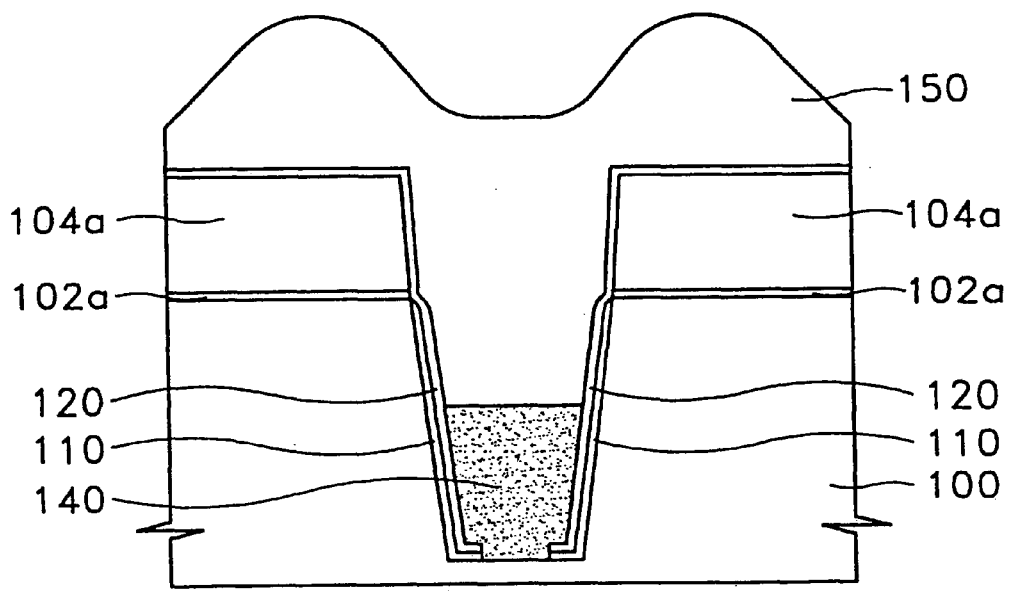

FIGS. 3J through 3M illustrate cross-sectional views for describing the steps of fully filling the trench T with a dielectric material. First, as shown in FIG. 3J, a second oxide layer 150 for filling the trench T is formed on the entire surface of the semiconductor substrate on which the silicon epitaxial growth layer 140 has been formed. The second oxide layer 150 may be formed by PECVD, LPCVD, APCVD or HDPCVD. Also, the second oxide layer 150 may be formed of SOG. The second oxide layer 150 may be one of a monolayer and a multilayer. Preferably, the second oxide layer 150 is formed of HDP oxide.

Figure 3K:
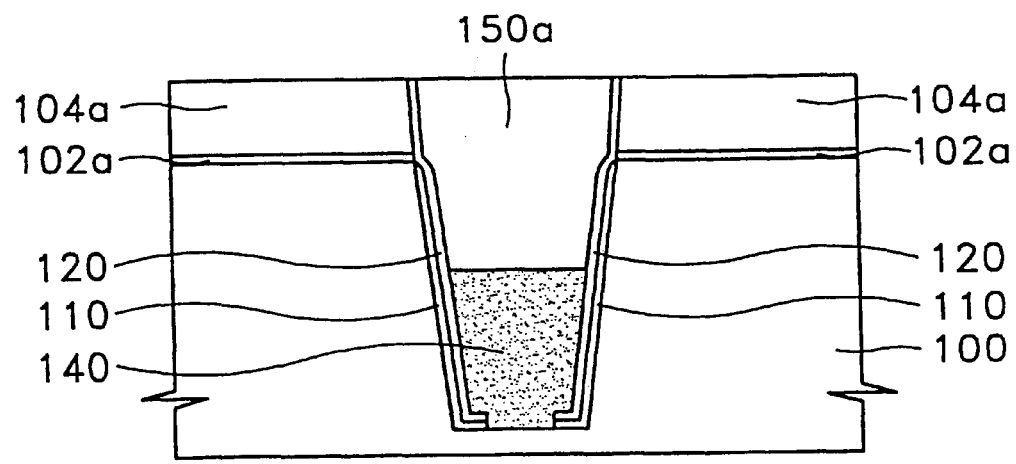

Referring to FIG. 3K, the entire surface of the semiconductor substrate on which the second oxide layer 150 has been formed is planarized by chemical mechanical polishing (CMP), until the upper surface of the silicon nitride layer pattern 104a is exposed. Simultaneously, a second oxide layer 150a is obtained, which was planarized so that its upper surface is at the same level as that of the silicon nitride layer pattern 104a.

Figure 3L:
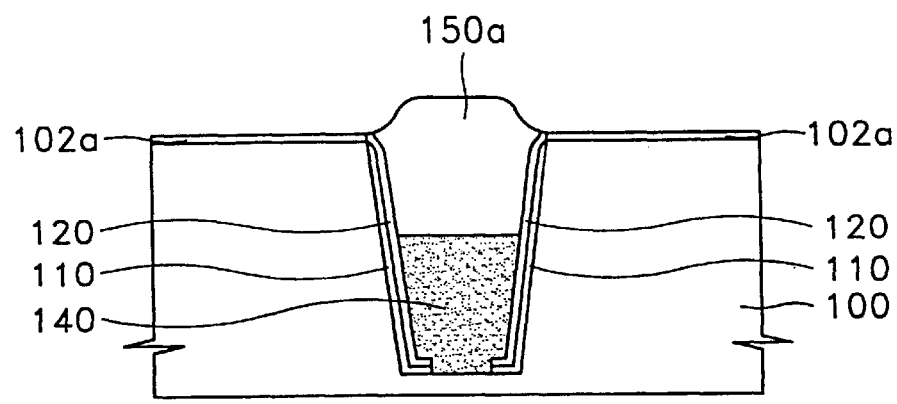

With reference to FIG. 3L, the silicon nitride layer pattern 104a is removed by a wet strip process using phosphoric acid. As shown in FIG. 3L, the step difference of the second oxide layer 150a may be lowered by the wet strip process.

Figure 3M:
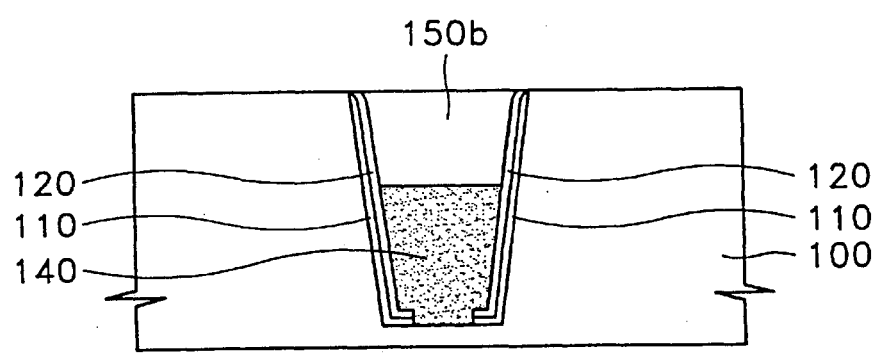

Referring to FIG. 3M, the pad oxide layer pattern 102a is removed by wet cleaning. As a result, the upper surface of the silicon substrate 100 is exposed and the step difference of the second oxide layer 150a is further lowered, thereby obtaining a second oxide layer pattern 150b on the upper surface of the silicon epitaxial growth layer 140 in the trench T.

Figure 4A:
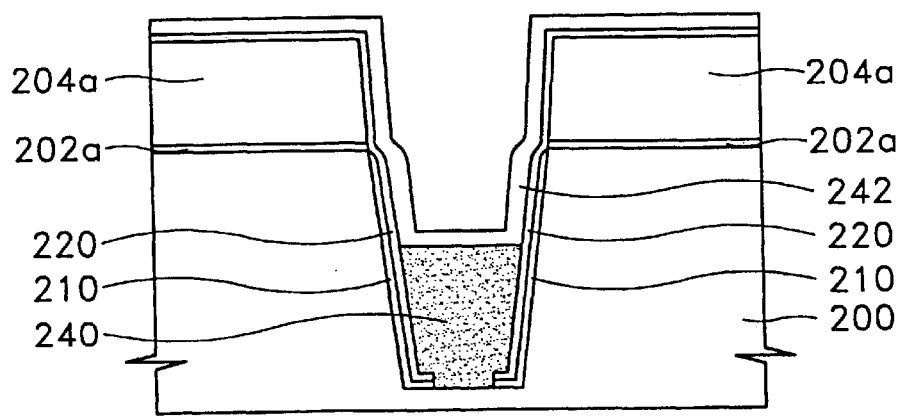
FIGS. 4A through 4C are cross-sectional views for describing the steps of a trench isolation method according to another embodiment of the present invention.
Figure 4B:
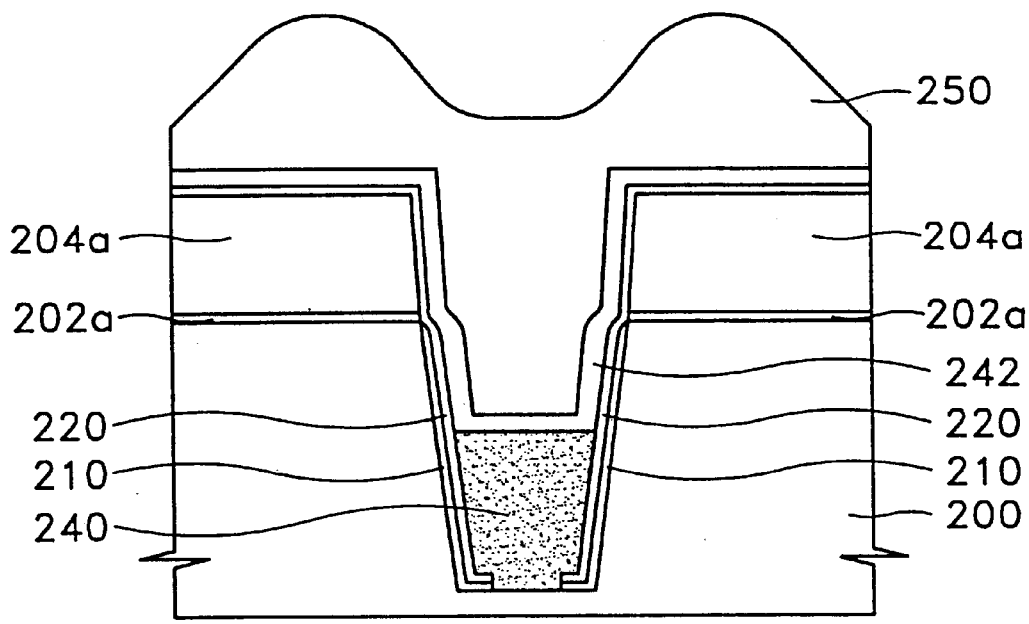
Figure 4C:
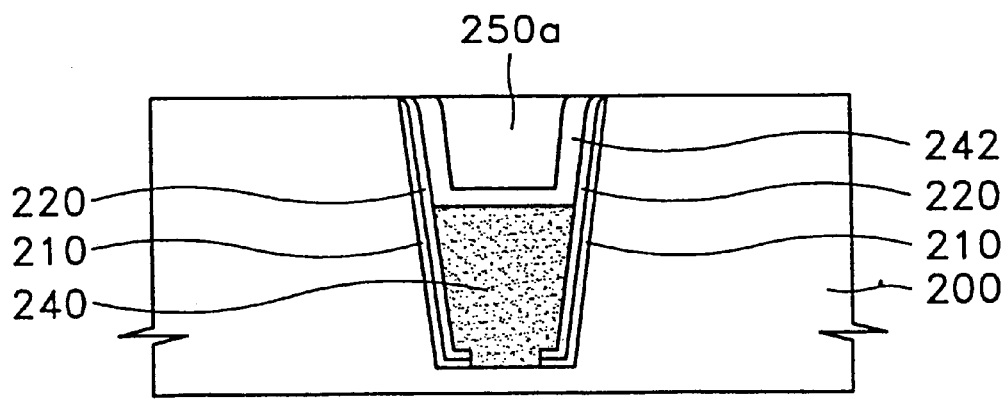

Cross-sectional views for describing a trench isolation method according to another embodiment of the present invention are shown in FIGS. 4A to 4C. Referring to FIG. 4A, as described with reference to FIGS. 3A to 3I, a trench is formed in a silicon substrate 200 using a pad oxide layer pattern 202a and a silicon nitride layer pattern 204a as an etching mask. Next, a first oxide layer 210, an anti-oxidative liner 220, and a silicon epitaxial growth layer 240 are formed.

Next, an oxide liner 242 is formed on the entire surface of the semiconductor substrate on which the silicon epitaxial growth layer 240 has been formed to cover the exposed surface of the anti-oxidative liner 220. The oxide liner 242 may be made of HTO. The oxide liner 242 is formed to protect the anti-oxidative liner 220, by preventing the anti-oxidative liner 220 from being damaged during a deposition process using plasma in a subsequent process for forming an oxide layer for filling the trench. Thus, the oxide liner 242 is formed to be thick enough, for example, a thickness of about 100~500 Å, to protect the anti-oxidative liner 220 in the subsequent process using plasma.

With reference to FIG. 4B, a second oxide layer 250 is formed on the entire surface on which the oxide liner 242 has been formed, by the same method as described with reference to FIG. 3J. Here, although the second oxide layer 250 is formed by HDPCVD, the anti-oxidative liner 220 is protected by the oxide liner 242 and thus the anti-oxidative liner 220 is not damaged by the plasma.

Referring to FIG. 4C, the upper surface of the silicon substrate 200 is exposed and a second oxide layer pattern 250a is formed to fully fill the trench by the same method as described with reference to FIGS. 3K through 3M.

Figure 5:
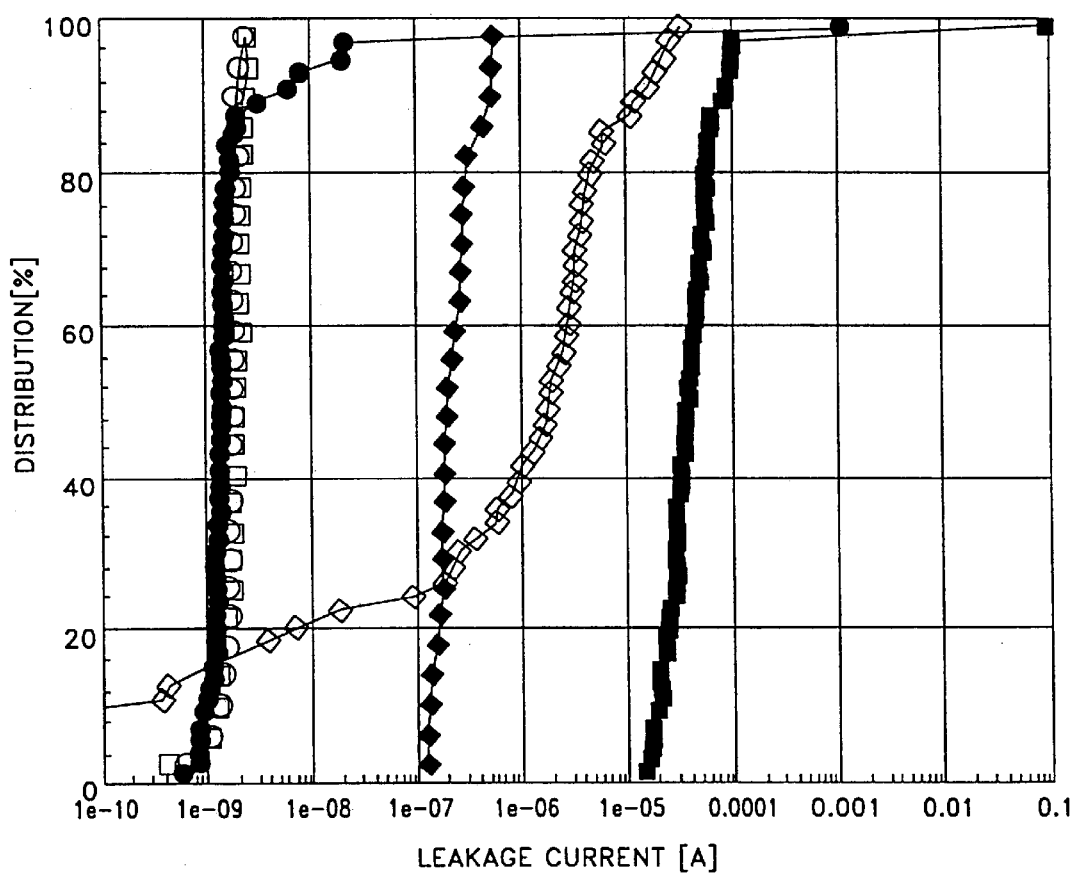
FIG. 5 is a graph for showing estimated results of leakage current properties of a semiconductor device which is manufactured by a trench isolation method according to the present invention.

FIG. 5 is a graph for showing estimated results for leakage current properties of a semiconductor device which is formed by a trench isolation method according to the present invention. For the estimate in FIG. 5, samples were made for forming a trench isolation region in a silicon substrate having the same structure as shown in FIG. 2 using a trench isolation method according to the present invention as described with reference to FIGS. 4A through 4C. In the samples, a silicon nitride liner having a thickness of 55 Å is formed as an anti-oxidative liner, creating an interface between the silicon epitaxial growth layer and the silicon nitride liner. Also, comparative samples were made for forming a trench isolation region on a silicon substrate under the same conditions as the samples manufactured according to the present invention except that forming an anti-oxidative liner was omitted. Thus, in the comparative samples, an interface between a silicon epitaxial growth layer and a first oxide layer made of thermal oxide were formed.

The samples of the present invention were divided into three cases. Namely, a sacrificial oxide layer was formed to a thickness of 110 Å on an exposed surface of the silicon substrate at the bottom surface of a trench by a thermal oxidation method and then removed by dry etching (Sample 1). A sacrificial oxide layer was formed to a thickness of 240 Å on the corresponding surface to that in Sample 1 and then removed by dry etching (Sample 2). A sacrificial oxide layer was formed to a thickness of 240 Å on the corresponding surface to that in Sample 1 and then removed by wet etching (Sample 3). In each sample, a silicon epitaxial growth layer was formed on the silicon substrate surface re-exposed by the removal of the sacrificial oxide layer and a trench isolation region was formed. Next, junction leakage currents for the samples 1 (-○-), 2(-●-), and 3(-□-) were measured and leakage current properties are estimated.

The comparative samples were also divided into three cases. A sacrificial oxide layer was formed to a thickness of 240 Å on an exposed surface of the silicon substrate at the bottom surface of a trench by a thermal oxidation method and then removed by wet etching (Sample 4). A sacrificial oxide layer was not formed (Sample 5). A sacrificial oxide layer was not formed and the estimate was performed right after a CMP process was performed using a silicon nitride layer pattern as an etch stopping layer (Sample 6). In each comparative sample, a trench isolation region was formed by forming a silicon epitaxial growth layer on the exposed silicon substrate surface. Next, junction leakage currents for the respective samples 4 (-■-), 5 (-◇-), and 6 (-◆-) were measured and leakage current properties were estimated.

As shown in FIG. 5, the junction leakage current of the samples of the present invention decrease by about $10^4$ times compared with that of the comparative samples. From this result, it is seen that in a case where an interface between a silicon epitaxial growth layer and a silicon nitride liner is formed in the trench, leakage current properties are improved.

Also, from the results in FIG. 5, it is seen that forming the sacrificial oxide layer does not affect leakage current properties when the trench isolation region is formed.

Optimum examples of the present invention are provided in the respective embodiments and the attached drawings. Here, certain terminology has been used to describe the present invention but not to limit the meaning and scope of the present invention claimed in claims.

According to the present invention, when a trench isolation region is formed in a silicon substrate, the lower half of the trench is filled with a silicon epitaxial growth layer and the remaining portion of the trench is filled with another oxide layer. Consequently, after the lower half of the trench is filled with a silicon epitaxial growth layer, the aspect ratio of the inside of the trench to be filled essentially decreases in a subsequent deposition process for filling the trench, and thus voids are not formed inside the trench. Also, an interface between the silicon epitaxial growth layer and the anti-oxidative liner, which is formed of silicon nitride, is formed in the trench isolation region. The electrical properties of a semiconductor device obtained from the structure including the interface can be improved.

Also, an anti-oxidative liner is formed in the trench isolation region of the semiconductor device. The anti-oxidative liner can efficiently prevent a silicon substrate from being excessively stressed and an active area from being oxidized near the corner of the trench. In addition, the anti-oxidative liner is formed to be thin enough to minimize etch wastage caused by a subsequent wet etching solution according to a wet loading effect. Therefore, no dent is made between the isolation area and the active area.

Although the invention has been described with reference to a preferred embodiments in detail, it will be apparent to one of ordinary skill in the art that modifications of the described embodiments may be made without departing from the spirit and scope of the invention.

What is claimed is:

1. A method of forming a trench isolation region in a semiconductor substrate, the method comprising:
   (a) forming a trench to a predetermined depth in a silicon substrate;
   (b) forming a first oxide layer on a bottom surface and sidewalls of the trench;
   (c) forming an anti-oxidative liner on the first oxide layer;
   (d) exposing the semiconductor substrate at the bottom surface of the trench by partially removing the anti-oxidative liner and the first oxide layer such that the first oxide layer and the anti-oxidative layer have an L-shaped cross-section along the sidewalls of the trench to a portion of the bottom surface of the trench;
   (e) forming a silicon epitaxial growth layer partially filling an inside of the trench defined by the anti-oxidative liner, by selectively epitaxially growing silicon from the exposed silicon substrate; and
   (f) forming a second oxide layer on the silicon epitaxial growth layer to fully fill the trench.

2. The trench isolation method of claim 1, further comprising providing a silicon substrate with a crystal orientation of [100].

3. The trench isolation method of claim 1, wherein the first oxide layer is formed of thermal oxide.

4. The trench isolation method of claim 1, wherein the anti-oxidative liner is formed until it reaches a thickness of about 50 to 70 Å.

5. The trench isolation method of claim 1, wherein the anti-oxidative liner is formed of one of the group consisting of silicon nitride ($Si_3N_4$), boron nitride (BN), and alumina ($Al_2O_3$).

6. The trench isolation method of claim 1, wherein step (d) comprises:

forming a protective oxide layer on an entire surface of the resultant structure having the anti-oxidative liner;

etching back the protective oxide layer to form a protective spacer covering the anti-oxidative liner extending along the sidewalls of the trench, and to expose the silicon substrate at the bottom surface of the trench; and removing the protective spacer.

7. The trench isolation method of claim 6, wherein the protective spacer has a width of about 200 to 1000 Å.

8. The trench isolation method of claim 6, further comprising removing the protective spacer by one of a wet etching method and a dry etching method.

9. The trench isolation method of claim 1, after step (d), further comprising:

forming a sacrificial oxide layer on the exposed silicon substrate; and removing the sacrificial oxide layer, wherein the silicon epitaxial growth layer is formed on the silicon substrate from which the sacrificial oxide layer is removed.

10. The trench isolation method of claim 9, wherein the sacrificial oxide layer is formed of thermal oxide.

11. The trench isolation method of claim 9, wherein the sacrificial oxide layer is removed by one of a wet etching method and a dry etching method.

12. The trench isolation method of claim 6, after step (d), further comprising forming a sacrificial oxide layer on the exposed silicon substrate, wherein the sacrificial oxide layer is removed in the step of removing the protective spacer.

13. The trench isolation method of claim 12, wherein the sacrificial oxide layer is formed of thermal oxide.

14. The trench isolation method of claim 12, wherein the protective spacer and the sacrificial oxide layer are removed by one of a wet etching method and a dry etching method.

15. The trench isolation method of claim 1, wherein the silicon epitaxial growth layer is formed by one of LPCVD and ultra high vacuum CVD (UHVCVD).

16. The trench isolation method of claim 1, wherein the second oxide layer is one of a monolayer and a multiplayer, and is formed by one of a group consisting of plasma enhanced chemical vapor deposition (PECVD), low pressure CVD (LPCVD), atmospheric pressure CVD (APCVD), high density plasma CVD (HDPCVD), and spin on glass (SOG).

17. The trench isolation method of claim 1, after the step (e), further comprising forming an oxide liner on the exposed surface of the anti-oxidative liner, wherein the second oxide layer is formed on the oxide liner.

18. The trench isolation method of claim 17, wherein the oxide liner is formed to a thickness of about 100 to 500 Å.

19. The trench isolation method of claim 17, wherein the oxide liner is formed of high temperature oxide (HTO).

20. The trench isolation method of claim 17, wherein the second oxide layer is composed of an oxide formed by HDPCVD.

21. The trench isolation method of claim 1, wherein the step (e) continues until about one-half of a vertical height of the trench is filled.

* * * * *